United States Patent [19]

Morrison et al.

[11] Patent Number: 4,841,257
[45] Date of Patent: Jun. 20, 1989

[54] HIGH-SPEED SAMPLING PHASE DETECTOR FOR CLOCK AND DATA RECOVERY SYSTEM

[75] Inventors: Larry R. Morrison; Vaughn J. Jenkins, both of Bountiful, Utah

[73] Assignee: Unisys Corporation, Blue Bell, Pa.

[21] Appl. No.: 173,799

[22] Filed: Mar. 28, 1988

[51] Int. Cl.[4] .................... H03D 13/00; H03L 7/08
[52] U.S. Cl. ..................... 331/26; 307/516; 328/134; 328/151; 375/81; 375/120
[58] Field of Search ............. 331/25, 26; 328/133, 328/134, 151; 307/514, 516; 375/120, 110, 81, 82, 94; 329/50, 122

[56] References Cited

U.S. PATENT DOCUMENTS

| | | | |
|---|---|---|---|
| 3,721,829 | 3/1973 | Benson | 328/151 X |
| 4,424,497 | 1/1984 | Fellinger | 329/50 X |
| 4,634,998 | 1/1987 | Crawford | 328/151 X |

Primary Examiner—Siegfried H. Grimm
Attorney, Agent, or Firm—John B. Sowell; Robert S. Bramson; Mark T. Starr

[57] ABSTRACT

A high-speed sample and hold phase detector for clock and data recovery systems is provided with a differentiating circuit coupled to a source of coded input data signals to provide bi-level differentiated output sampling pulses which are applied to a high-speed transformer. The output of the high-speed transformer is coupled to a high-speed fullwave diode bridge rectifying circuit whose output provides the error signal for the clock and data recovery circuit. The transformer is provided with a secondary winding having a center tap connected to a bi-level clock having clock signals whose rate is at twice the data rate. The D.C. error signal voltage amplitude is proportional to the phase difference between the clock signal connected to the center tap of the secondary winding of the transformer and the differentiated sampling pulses. The sampling pulses are employed to sample the clock signal which provides higher stability and enhances noise reduction.

13 Claims, 3 Drawing Sheets

HIGH-SPEED SAMPLING PHASE DETECTOR FOR CLOCK AND DATA RECOVERY SYSTEM

FIELD OF THE INVENTION

The present invention relates to phase detectors of the type employed in RF receiving systems for recovering data and a clock from a bi-level self-clocking data signal. More specifically, the present invention permits the recovery of unbounded run related data with its associated clock at data rates up to one gigahertz.

DESCRIPTION OF THE PRIOR ART

Heretofore, high-speed digital phase detectors require fifty percent duty cycles at digital voltage levels. Such prior art digital phase detectors are active devices which require more power to operate and the more complex circuitry requires more components which consume a greater real estate space on the electronic boards and if there are long runs between data pulses, the signals being supplied to the accompanying phase lock loop are incapable of holding the phase lock loop in synchronization.

There is a need for a high-speed sampling phase detector which is operable over varying data run links and is simpler and more reliable than prior art devices.

SUMMARY OF THE INVENTION

It is a principal object of the present invention to provide a novel phase detector for recovering data and a clock from high-speed radio frequency signals.

It is another principal object of the present invention to provide a novel phase detector having a full wave RF sampling and hold circuit for varying data run length data with increased sensitivity.

It is another principal object of the present invention to provide a novel phase detector which samples the clock pulse edges with the data pulses for producing enhanced noise reduction.

It is another object of the present invention to provide a novel phase detector circuit in which the phase detector is part of a first integrating circuit.

It is another object of the present invention to provide a novel clock and data recovery system for recovering both clock and data from a single high-speed RF self-clocking data source.

It is another object of the present invention to provide a novel clock and data recovery system which includes a second integrating and smoothing circuit for enhancing closed loop stability of the voltage control oscillator in the phase lock loop.

It is another object of the present invention to provide a clock and data recovery system having very accurate stable output clock signals from the VCO representative of the input data stream.

It is another object of the present invention to provide an improved clock and data recovery system employing bi-level clock and data signals in the phase detectors for enhancing noise immunity.

According to these and other objects of the present invention, there is provided a novel high-speed sample and hold phase detector coupled to an improved high-speed phase tracking loop for recovering clock and data signals from high-speed radio frequency input data streams. The incoming bi-level data stream is differentiated and applied as an input to a transformer coupled fullwave high-speed diode bridge sampling and hold phase detector whose output is applied to a novel high-speed phase tracking system to produce clock signals at twice the data rate and a data output stream synchronized with the recovered clock.

DESCRIPTION OF THE PREFERRED EMBODIMENT

Figure 1:
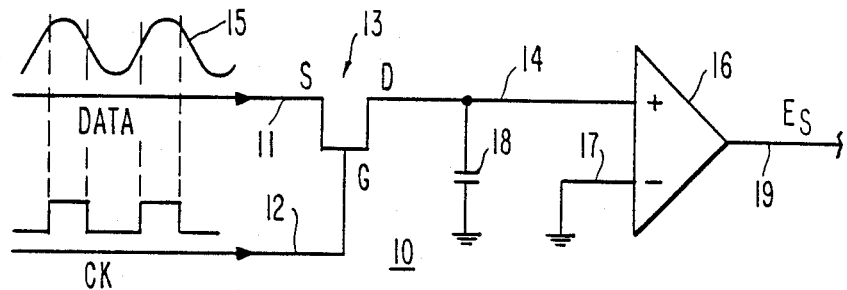
FIG. 1 is a simplified circuit diagram of a prior art sample and hold circuit.

Refer now to FIG. 1 showing a simplified prior art sample and hold circuit 10 which comprises input lines 11 and 12 on which are applied the incoming data signal and the synchronous clock. Lines 11 and 12 are connected to the source and gate of an FET switch 13 which produces a DC output on line 14 representative of the sample DC level of the data pulse 15. In passing, it will be noted that the clock is sampling the data signal. A DC signal is produced on the drain output of FET 13 on line 14 which is applied to the positive side of a differential amplifier 16 whose negative terminal is shown connected to ground via line 17. The AC signal on line 14 is also applied to a holding capacitor 18 connected between input line 14 and ground which serves to store the data between pulses. The output of differential amplifier 16 on line 19 provides an error signal indicative of the phase error between the clock and the data signal which can be applied to a phase lock loop or other type of tracking circuit as well known in the prior art.

Figure 2:
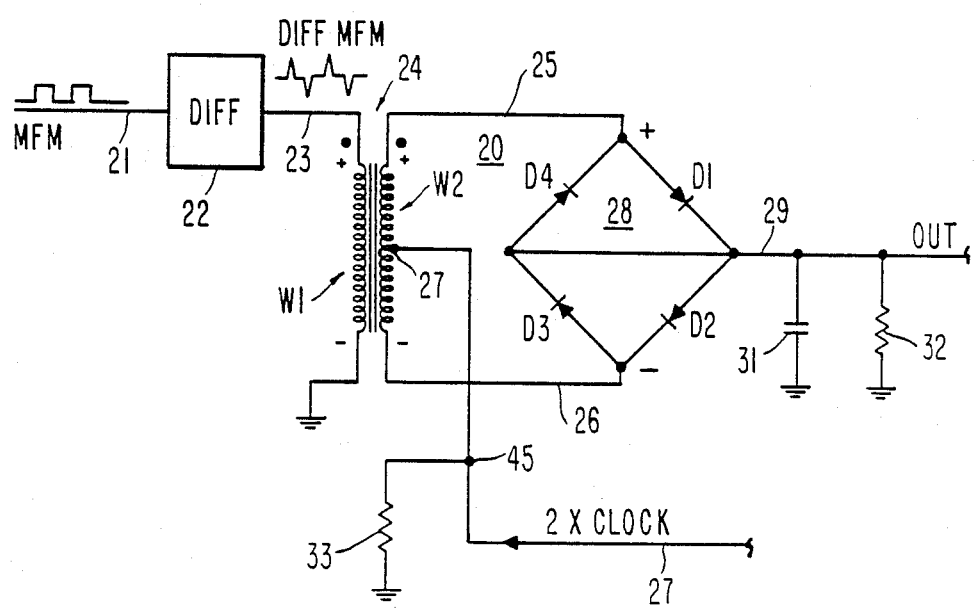
FIG. 2 is a circuit diagram of a preferred embodiment of the present invention high-speed sample and hold phase detector.

Refer now to FIG. 2 showing a preferred embodiment high-speed sample and hold phase detector 20 having a bi-level MFM data signal applied to input line 21. The bi-level data signal is differentiated in differentiator 22 to provide a differentiated MFM output signal on line 23 which is coupled to the primary winding W1 of transformer 24. The secondary coupling or winding W2 of transformer 24 has two output lines 25 and 26 and a center tap 27 that is connected to the incoming clock signal which is at twice the data rate of the data on input line 21. The clock signal on line 27 is also a bi-level signal as will be explained hereinafter. The output lines 25 and 26 across the winding W2 of transformer 24 are connected across a high-speed diode bridge 28 comprising diodes D1 to D4. When a positive differentiated MFM pulse arrives at the positive phase dot of winding W1 it produces a positive phase output at the phase dot of winding W2 and on line 25 and a negative signal at output line 26 so that conventional current flows across diode D1 and through diode D2 turning diodes D1 and D2 ON. When the current reverses at input line 23, line 26 goes high and line 25 goes low causing conventional current to flow through diode D3 and D4, thus producing positive output signals on the single shunted output line 29 which is coupled to a utilization device as will be explained hereinafter. Capacitor 31, connected between output line 29 and ground, serves to maintain the voltage output on line 29 relatively constant for incoming information of varying data run links on line 21. A load resistor 32 is provided between the output line 29 and ground as a DC return path for the diode bridge 28. Resistor 33, connected to clock input line 27 and to ground terminates line 27 and provides a DC return path for the clock signal on line 27 as well as providing a reference for the bi-level clock as will be explained hereinafter.

Figure 3:
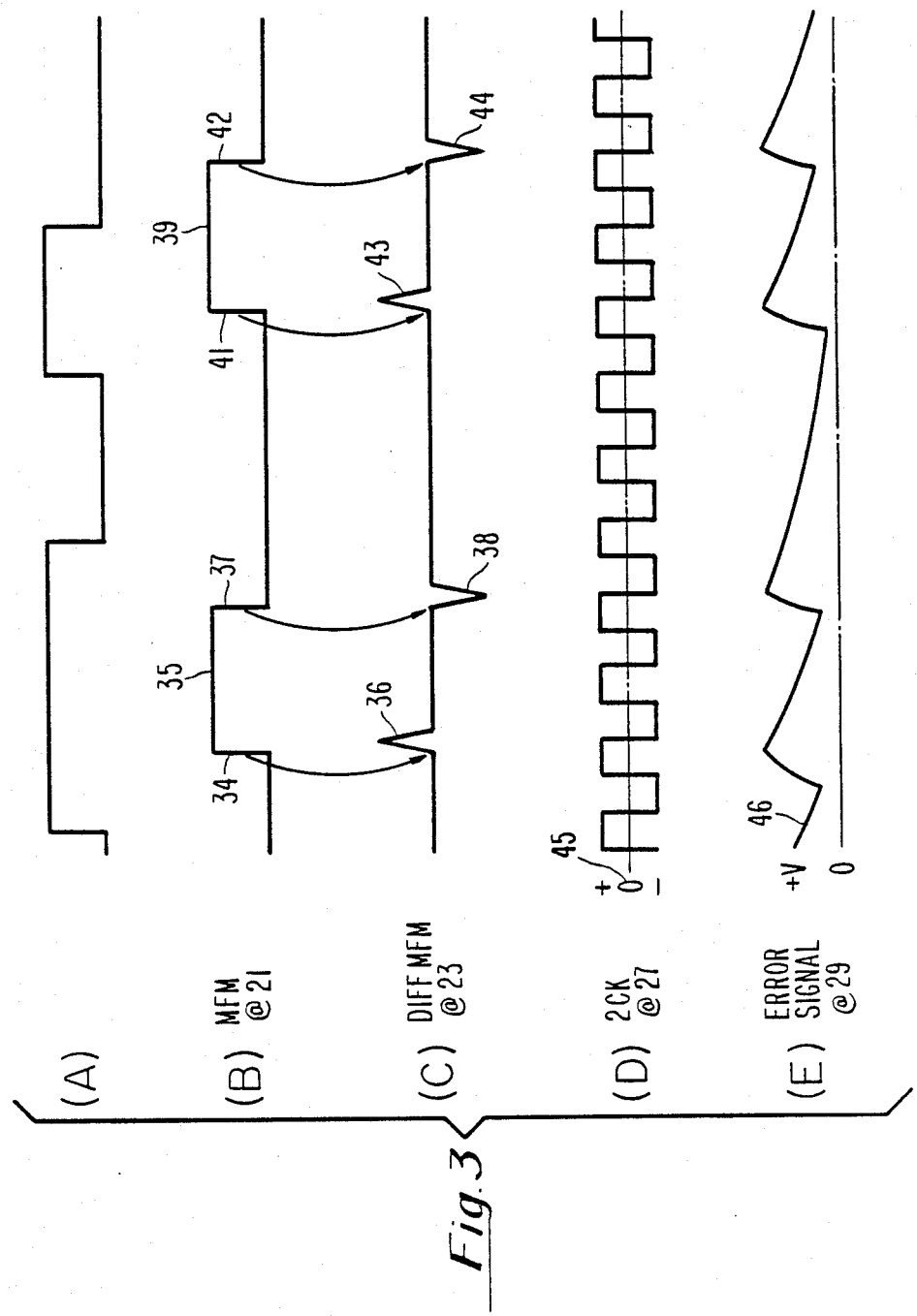
FIG. 3 shows clock and data timing waveforms provided for better explaining the operation of the circuit of FIG. 2.

Refer now to FIG. 3 showing clock and data timing waveforms for the circuit of FIG. 2. The data signal employed to generate the MFM signal on line 21 is shown in FIG. 3A in a 01 coded data format. The MFM coded signal is shown in FIG. 3B which is representative of the bi-level coded data shown in FIG. 3A. The leading edge 34 of MFM waveform 35 becomes differentiated in differentiator 22 to produce waveform 36 in FIG. 3C. Similarly, the trailing edge 37 of waveform 35 is differentiated and produces a waveform 38 of opposite polarity which will be inverted in the transformer 24. Similarly, leading and trailing edges 41 and 42 of pulse 39 produce differentiated pulses 43 and 44 of opposite polarity. The aforementioned clock signal on line 27 which is occurring at twice the data rate is shown in FIG. 3D having a center zero reference voltage level 45 between the positive and negative excursions of the pulses on line 27. The ground reference level terminal 45 is established by its connection through resistor 33 as mentioned hereinbefore.

Refer now to FIG. 3E showing the output voltage error signal waveform 46 which is referenced to a zero or ground level by its connection to resistor 32 connected to output line 29.

Figure 4:
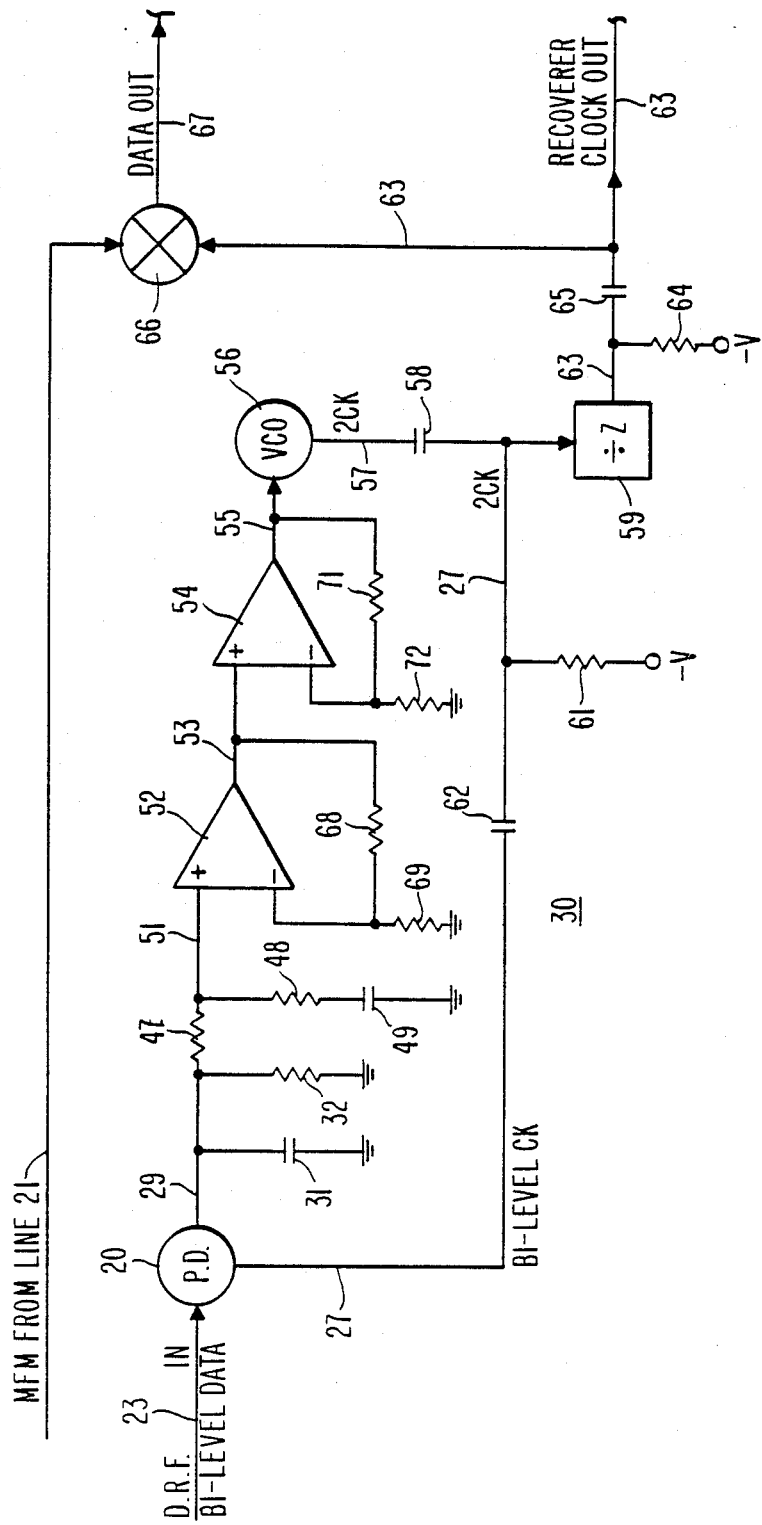
FIG. 4 is a circuit diagram of a preferred embodiment clock and data recovery system employed with the novel phase detector of FIG. 2.

Refer now to FIG. 4 showing a preferred embodiment clock and recovery loop system used in conjunction with the novel phase detector 20. The differentiated RF input signal is a bi-level data signal on line 23 which is applied to the phase detector 20 to produce the aforementioned error signal on line 29, also shown in FIG. 3E. The signal on line 29 is already integrated when passed through the impedance of the phase detector and through resistor 31 and is integrated a second time when passed through resistors 47, 48 and capacitor 49. Resistor 47 is much greater than resistor 48 and the error signal on line 51 between the resistor divider is applied to the positive side of differential amplifier 52 to produce a predetermined amplification of the input signal on output line 53 which is in turn applied to the positive input of the second differential amplifier 54 to produce an additional amplification without distortion on output line 55. The output is the tuning voltage resulting from the error signal being applied to voltage control oscillator (VCO) 56 which is operating at approximately two gigahertz plus or minus ten percent. The output clock signal on line 57 is applied through a capacitor 58 so that it can be level shifted to operate the divide by two counter 59, otherwise capacitor 58 is not required for producing the two times clock on line 27. The output on line 27 is shown connected to the level shifting resistor 61 connected to a minus reference voltage to implement operation of the gallium arsenide divide by two counter 59. The two times clock on lines 57 and 27 is passed through capacitor 62 before being applied to the phase detector 20 to allow a bi-level clock to be generated at the terminal 45 shown in FIG. 2 and explained with regard to FIG. 3E hereinbefore. The output of the divide by two counter 59 on line 63 is biased to a negative voltage through resistor 64 for operation of the gallium arsenide counter 59. The signal on line 63 is passed through a capacitor 65 which provides a bi-level recovered clock output on line 63 which is in synchronization with the MFM input data stream on line 27 shown also applied to the input of mixer 66 to produce a data output stream on line 67. Differential amplifiers 52 and 54 are shown having negative feedback coupled through resistors 68, 69 and 71, 72 respectively for purposes of establishing a predetermined gain of the loop amplifiers.

Having explained the basic operation of the preferred embodiment clock and recovery loop system 30 shown in FIG. 4, it will be understood that the recovered clock jitter on output lines 27, 57 and 63 is determined by the stability of the closed loop. The stability of closed loop is affected by the gain of the phase detector 20, the roll off characteristics of the loop integrating circuit and filter 47, 48, 49 as well as the modulation sensitivity of the VCO 56. The jitter is suppressed by maintaining a narrow optimum pulse width of the differentiated MFM signal on line 23 and the base of the aforementioned MFM differentiated pulses 36, 38, 43 and 44 is maintained less than 90 degrees, which is only half the width of the clock pulses on line 27. The width of the differentiated MFM pulses is maintained by the time constant of the differentiator 22 and the rise and fall times of the input data stream. The amplitude of the differentiated MFM signal on line 23 is determined by the rise and fall time of the leading and trailing edges of the MFM data signal on line 21 and is maintained at a level greater than the voltage level of the two times clock so that the data on line 23 is the trigger or switch signal for diode bridge 28 for sampling the clock signals on line 27 and not vice versa. By using the feature of sampling the clock signals rather than the clock sampling the data signals, the noise reduction is enhanced because the sampling takes place at the lower data rate versus the higher clock rate.

What is claimed:

1. A high-speed sampling phase detector for clock and data recovery systems, comprising:
    differentiating means for receiving coded input data signals and for generating sampling pulses,
    high-speed transformer means having a primary winding coupled to the sampling pulse output of said differentiating means,
    high-speed fullwave diode bridge rectifying means,
    a secondary winding of said transformer means being coupled to the input of said diode bridge rectifying means,
    clock means having clock signals whose rates is at twice the data rate,
    said clock means being connected as an input to a center tap of said secondary winding of said transformer means,
    error signal means coupled to the output of said bridge rectifying means,
    said sampling pulses being employed to sample portions of said clock signals to provide a D.C. error signal at the output of said bridge rectifying means.

2. A high-speed sampling phase detector as set forth in claim 1 wherein said sampling pulses and said clock signals are bi-level signals.

3. A high-speed sampling phase detector as set forth in claim 1 wherein said differentiating means sets the peak of said sampling pulses at a desired predetermined level in excess of the peak of said clock pulses.

4. A high-speed sampling phase detector as set forth in claim 3 which further comprises capacitor means coupled to the output of said bridge rectifying means for holding said error signal voltage level over long varying data run lengths.

5. A high-speed sampling phase detector as set forth in claim 4 which further comprises a load resistor coupled to the output of said bridge rectifying means for providing a D.C. return path for the rectified D.C. error signal.

6. A high-speed sampling phase detector as set forth in claim 5 wherein said input data signals are MFM coded data signals and the output of said differentiator are bi-level differentiated MFM signals.

7. A high-speed sampling phase detector as set forth in claim 5 wherein said differentiating means provide bi-level sampling pulses having narrow base pulse widths for noise rejection.

8. A high-speed sampling phase detector as set forth in claim 4 wherein the impedance of said phase detector and said capacitor form a first integrating circuit for smoothing the error signal output from said bridge rectifying means.

9. A high-speed sampling phase detector as set forth in claim 8 which further includes a second integrating circuit connected to said first integrating circuit formed by a dividing resistor and a second capacitor for further smoothing said error signal output from said bridge rectifying means.

10. A high-speed sampling phase detector as set forth in claim 5 which further includes first and second series coupled differential amplifiers coupled to the output of said second integrating circuit for providing a tuned voltage error signal indicative of the phase detector output.

11. A high-speed sampling phase detector as set forth in claim 10 which further includes a voltage controlled oscillator coupled to said tuned voltage output of said differential amplifiers for providing a recovered clock at twice the data rate.

12. A high-speed sampling phase detector as set forth in claim 11 wherein said recovered clock output from said voltage controlled oscillator is coupled to said clock means and further includes a capacitor in series in said clock output to provide a bi-level clock signal at twice the data rate.

13. A high-speed sampling phase detector as set forth in claim 12 which further includes a bi-level terminating resistor connected to said clock means referenced to a ground reference voltage to provide a reference voltage for said bi-level clock signals.

* * * * *